United States Patent
Lee et al.

(10) Patent No.: US 9,078,378 B2
(45) Date of Patent: Jul. 7, 2015

(54) HEAT EMISSION DEVICE FOR JUNCTION BOX PRINTED CIRCUIT BOARD

(71) Applicants: Hyundai Motor Company, Seoul (KR); Kia Motors Corporation, Seoul (KR); Yura Corporation Co., Ltd, Cheongwon, Chungbuk (KR)

(72) Inventors: Young Jong Lee, Seoul (KR); Byung Kwan Kang, Incheon (KR); Jong Won Lee, Gyeonggi-do (KR)

(73) Assignees: Hyundai Motor Company, Seoul (KR); Kia Motors Corporation, Seoul (KR); Yura Corporation Co., Ltd., Cheongwon (KR)

( * ) Notice: Subject to any disclaimer, the term of this patent is extended or adjusted under 35 U.S.C. 154(b) by 251 days.

(21) Appl. No.: 13/671,984

(22) Filed: Nov. 8, 2012

(65) Prior Publication Data
US 2014/0009889 A1    Jan. 9, 2014

(30) Foreign Application Priority Data
Jul. 4, 2012 (KR) .................. 10-2012-0072587

(51) Int. Cl.
H05K 7/20    (2006.01)

(52) U.S. Cl.
CPC ........ *H05K 7/20509* (2013.01); *H05K 7/20854* (2013.01); *H01L 2924/0002* (2013.01)

(58) Field of Classification Search
USPC ............. 361/676–678, 679.46–679.54, 361/688–722, 752, 760, 784–792, 831
See application file for complete search history.

(56) References Cited

U.S. PATENT DOCUMENTS

| | | | | |
|---|---|---|---|---|
| 5,737,194 | A  * | 4/1998 | Hopkins et al. | 361/800 |
| 6,116,916 | A  * | 9/2000 | Kasai | 439/76.2 |
| 6,162,990 | A  * | 12/2000 | Sakamoto | 174/59 |
| 6,796,808 | B2 * | 9/2004 | Hosoe et al. | 439/76.2 |
| 7,390,198 | B2 * | 6/2008 | Oka et al. | 439/76.2 |
| 8,081,422 | B2 * | 12/2011 | Shannon et al. | 361/624 |
| 8,564,956 | B2 * | 10/2013 | Grajcar | 361/712 |
| 2009/0052142 | A1 * | 2/2009 | Brewer et al. | 361/721 |
| 2011/0188207 | A1 * | 8/2011 | Won et al. | 361/709 |

FOREIGN PATENT DOCUMENTS

| | | |
|---|---|---|
| JP | 07297562 A | 11/1995 |
| JP | 20-0311701 | 4/2003 |
| JP | 2004221256 A | 8/2004 |
| JP | 2007-109993 A | 4/2007 |
| KR | 10-2001-0011098 A | 2/2001 |
| KR | 10-2012-0018843 | 3/2012 |

(Continued)

*Primary Examiner* — Courtney Smith
(74) *Attorney, Agent, or Firm* — Mintz Levin Cohn Ferris Glovsky and Popeo, P.C.; Peter F. Corless (57) ABSTRACT

The present disclosure provides a heat emission/radiation device for a junction box printed circuit board (PCB), which allows a next-generation intelligent junction box PCB to be manufactured in a dual-layer structure that maximizes heat emission effects. In other words, the present invention provides a heat emission device for a junction box PCB, in which a PCB having an IPS semiconductor device mounted thereon is mounted as a dual-layer structure by folding, such that the PCB may be easily installed in a small space of a vehicle, and a heat absorption and emission path for effectively emitting heat generated by the PCB mounted as the dual-layer structure is formed.

18 Claims, 5 Drawing Sheets

(56) References Cited

FOREIGN PATENT DOCUMENTS

| KR | 10-1116881 B1 | 3/2012 |
| KR | 10-2012-0037670 | 4/2012 |
| KR | 10-2012-0044077 | 5/2012 |

* cited by examiner

HEAT EMISSION DEVICE FOR JUNCTION BOX PRINTED CIRCUIT BOARD

CROSS-REFERENCE TO RELATED APPLICATION

This application claims under 35 U.S.C. §119(a) the benefit of Korean Patent Application No. 10-2012-0072587 filed on Jul. 4, 2012, the entire contents of which are incorporated herein by reference.

BACKGROUND (a) Technical Field

The present invention relates to a heat emission device of a junction box printed circuit board (PCB). More particularly, the present invention relates to a heat emission device for a junction box PCB, which allows a next-generation intelligent junction box PCB to be manufactured in a dual-layer structure that maximizes heat emission.

(b) Background Art

As is well known, a vehicle junction box mainly supplies and distributes electricity for electrical and electronic equipment that needs it, and the junction box also accommodates and protects wires and devices mounted therein (e.g., a fuse, a relay, etc.), and maintains operating efficiency through rapid heat emission.

When a relay, a fuse, or the like, of the junction box is damaged, the damaged part must be replaced. To solve problems caused by frequent replacement and further diagnosis of the fault of each device part, a next-generation intelligent junction box has been developed that can be used semi-permanently by replacing a relay, a fuse, or the like with an intelligent power switching (IPS) semiconductor device.

Figure 7:
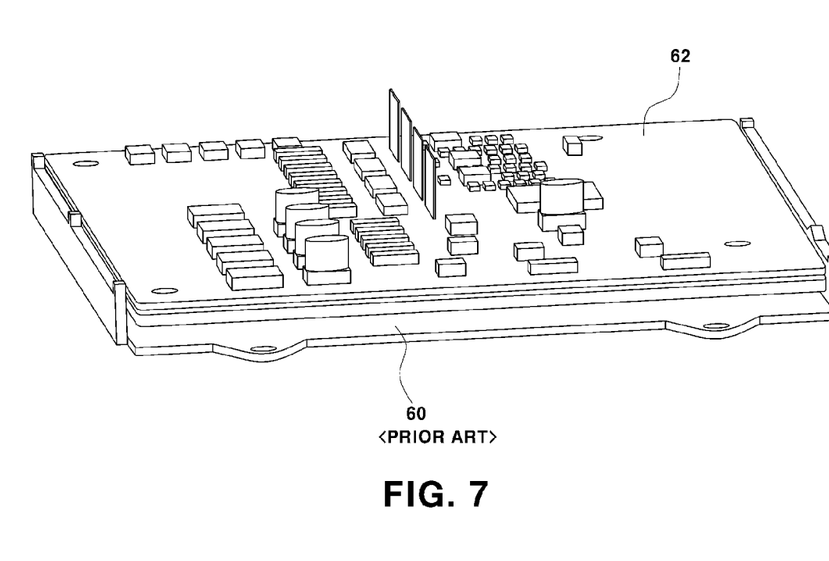
FIG. 7 is a perspective view showing a conventional art junction box PCB assembled to an aluminum case.

The next-generation intelligent junction box performs not only power supply and distribution, but also a fault diagnosis function with respect to each device part, and thus a large-area printed circuit board (PCB) has to be adopted on which IPS semiconductor devices for high current (HC) may be mounted in an optimal arrangement. However, such next-generation intelligent junction boxes have significant limitations because it is difficult to mount a large-area PCB in the limited small space that exists in a vehicle. Moreover, as shown in FIG. 7, conventional art methods for heat emission (i.e., cooling) of a large-area PCB 60 on which IPS semiconductor devices are mounted typically employ an aluminum case 62 on which the PCB 60 is seated. Unfortunately, the heat emission effect (i.e., the ability to cool) of an IPS semiconductor device having such a configuration is reduced when the device generates a high temperature during operation.

In other words, a conventional aluminum case provides protection by seating the large-area PCB, and also performs heat emission and cooling functions by emitting, or radiating, the heat generated by the IPS semiconductor device of the large-area PCB to the outside. Unfortunately, heat by an IPS semiconductor device for high current is very high, such that the conventional art aluminum case with a simple structure cannot effectively emit, or radiate, the high-temperature heat generated during the operation of the IPS semiconductor device.

SUMMARY OF THE DISCLOSURE

The present invention has been made in an effort to solve the above-described problems associated with the conventional art, and to provide a heat emission device for a junction box PCB, in which a PCB having an IPS semiconductor device mounted thereon is mounted as a dual-layer structure by folding, such that the PCB can be easily installed in a limited small space of a vehicle, and a heat absorption and emission path for effectively emitting heat generated from the PCB mounted as the dual-layer structure is formed.

In one aspect, the present invention provides a heat emission device for a junction box PCB, the heat emission device including a heat emission and protection metallic case having a lower PCB mounted thereon, a heat absorption and emission metallic board deposited on the lower PCB in such a way as to transfer heat, an upper PCB that may be folded to conduct electricity with the lower PCB, the upper PCB mounted on the heat absorption and emission metallic board, and a heat absorption and emission means provided on a four-direction side plate and a bottom plate of the heat absorption and emission board to absorb and emit heat from the lower PCB.

The heat absorption and emission means according to a preferred embodiment of the present invention is structured such that a plurality of up/down slots, left/right slots, and diagonal slots are formed on the bottom plate of the heat absorption and emission metallic board, and a heat transfer boss, which contacts the lower PCB in such a way as to transfer heat, is inserted into the respective slots in such a way as to be movable between a variety of desirable positions. One or more heat transfer bosses may be associated with any particular slot.

Preferably, a fastening screw groove may be formed on a top surface of the heat transfer boss, and a washer may be applied to the fastening screw groove to allow a fastening screw to be inserted into and engaged with the fastening screw groove. The washer then may engage the top surface of the bottom plate of the metallic board.

More preferably, a slide protruding end may be integrally formed with the inner walls along the lower perimeter of the inner walls. An outer-diameter surface of the heat transfer boss may comprise a slide groove into which the slide protruding end may be inserted.

In addition, a plurality of heat emission ribs may be formed along one or more sides of the metallic board. In a preferred embodiment, the plurality of heat emission ribs may protrude from one or more sides of the metallic board at equal intervals.

Furthermore, an assembly end having an assembly hole for coupling with the heat emission and protection metallic case may be further formed integrally with one or more corner positions of metallic board.

Preferably, to improve heat transfer effects, a thermal grease may be applied to a lower portion of the heat transfer boss that contacts the lower PCB.

Other aspects and preferred embodiments of the invention are discussed infra.

BRIEF DESCRIPTION OF THE DRAWINGS

The above and other features of the present invention will now be described in detail with reference to an exemplary embodiment thereof illustrated the accompanying drawings which are given hereinbelow by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, an exemplary embodiment of the present invention will be described in detail with reference to the accompanying drawings to allow those of ordinary skill in the art to easily carry out the present invention. While the invention will be described in conjunction with the exemplary embodiment, it will be understood that the present description is not intended to limit the invention to the exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The present invention focuses on mounting a printed circuit board (PCB) for a next-generation intelligent junction box, that is, a large-area PCB, on which an IPS semiconductor device for high current, or the like, is mounted as a foldable structure and maximizing heat emission effect by using a heat absorption and emission board.

For example, as shown in FIGS. 1 through 4, in addition to a heat emission and protection metallic case 10 that may be made of an aluminum material, which has a lower PCB 12 mounted thereon, a heat absorption and emission board 20 having an upper PCB 22 mounted thereon may be provided an formed of an aluminum material.

Figure 6:
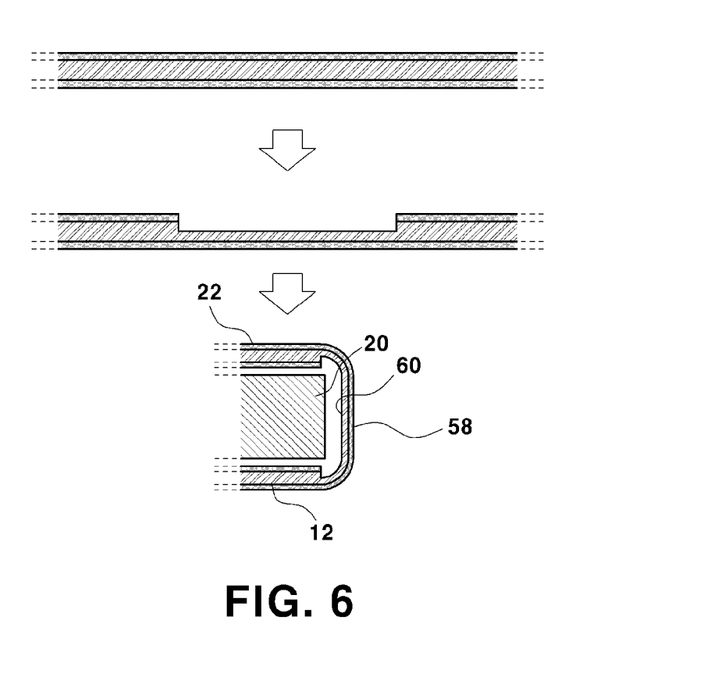
FIG. 6 is a schematic cross-sectional view showing that a junction box PCB mounted on a heat emission device according to the present invention includes upper and lower PCBs which are foldable.

The heat emission and protection metallic case 10 may have the lower PCB 12 seated and assembled thereon to protect the lower PCB 12 and emit/radiate heat from the lower PCB 12 to outside. However, if a semiconductor device such as an IPS device, which generates high-temperature heat, is mounted on the lower PCB 12, it may be necessary to maximize heat emission (i.e., cooling) performance by layering and assembling the heat absorption and emission metallic board 20 on the heat emission and protection metallic case 10 and the lower PCB 12. For example, the heat absorption and emission metallic board 20 may have the upper PCB 22 seated and assembled thereon to absorb and emit heat from the lower PCB 12. The lower PCB 12 and the upper PCB 22 may be folded to conduct electricity therebetween and mounted on the heat emission and protection metallic case 10 and the heat absorption and emission metallic board 20, respectively. For example, as shown in FIG. 6, the folded portion may be a film insulator 60 comprising a flexible material in which a conductive metallic pattern (58, e.g., copper foil) is patterned such that folding may be performed freely.

Herein, an exemplary structure of the heat absorption and emission metallic board 20 will be described in more detail with reference to FIGS. 1 through 3.

The heat absorption and emission metallic board 20 may be manufactured with a smaller area than the heat emission and protection metallic case 10, in which a four-direction side plate 24 and a bottom plate 26 are molded as one piece. A heat absorption and emission means 30 for absorbing heat from the lower PCB 12 and emitting the heat to outside may be formed on the four-direction side plate 24 and the bottom plate 26 of the heat absorption and emission metallic board 20.

More specifically, as one exemplary construction of the heat absorption and emission means, a plurality of holes may be formed to penetrate the bottom plate 26 of the heat absorption and emission metallic board 20, and an up/down slot 32, a left/right slot 34, and/or a diagonal slot 36 may be formed to freely penetrate a surface between holes. In the respective slots 32, 34, and 36, a heat transfer boss 38 which contacts the lower PCB 12 in such a way to transfer heat to the lower PCB 12 may be inserted and engaged in such a way as to move between positions.

Figure 3:
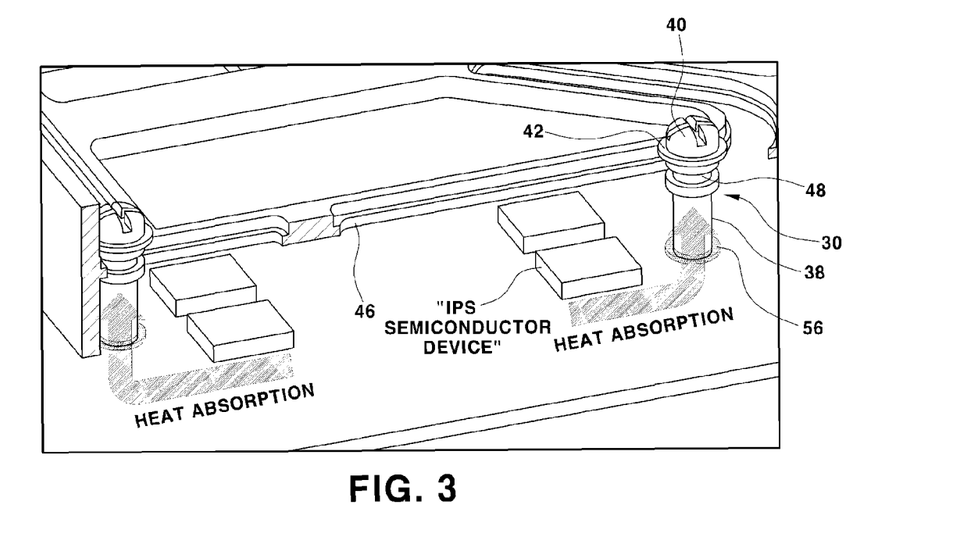
FIG. 3 is a main-part enlarged perspective view showing a state where a heat transfer boss of a heat emission device for a junction box PCB according to an exemplary embodiment of the present invention is closely assembled on a lower PCB.

On the inner walls of the respective slots 32, 34, and 36 formed on the bottom plate 26 may be a slide protruding end 46 integrally formed with, and along, the longitudinal direction of the inner walls, for example, as shown in FIG. 3. On an outer-diameter surface of the heat transfer boss 38 may be formed a slide groove 48 such that the slide protruding end 46 is inserted into the slide groove 48 in a slide-contact manner, thereby allowing the heat transfer boss 38 to be held and be moved to a desired position along the respective slots 32, 34, and 36.

For example, to fix the heat transfer boss 38 once the heat transfer boss 38 is moved to a desired position, preferably a position adjacent to an IPS semiconductor device which generates a high degree of heat from semiconductor devices attached onto the lower PCB 12, a fastening screw groove may formed on a top surface of the heat transfer boss 38, such that a washer 42 may be applied to the fastening screw groove to allow a fastening screw 40 to be inserted into, and engaged with, the fastening screw groove.

More specifically, after the heat transfer boss 38 is moved to a position adjacent to an IPS semiconductor device, the fastening screw 40 may be inserted into the fastening screw groove of the heat transfer boss 38 and then fastened, such that the lower-end (bottom) surface of the heat transfer boss 38 firmly contacts the surface of the lower PCB 12.

In an exemplary embodiment, a thermal grease 56 may be applied onto a lower portion of the heat transfer boss 38 that contacts the lower PCB 12 to facilitate heat transfer from the lower PCB 12 to the heat transfer boss 38.

Figure 1:
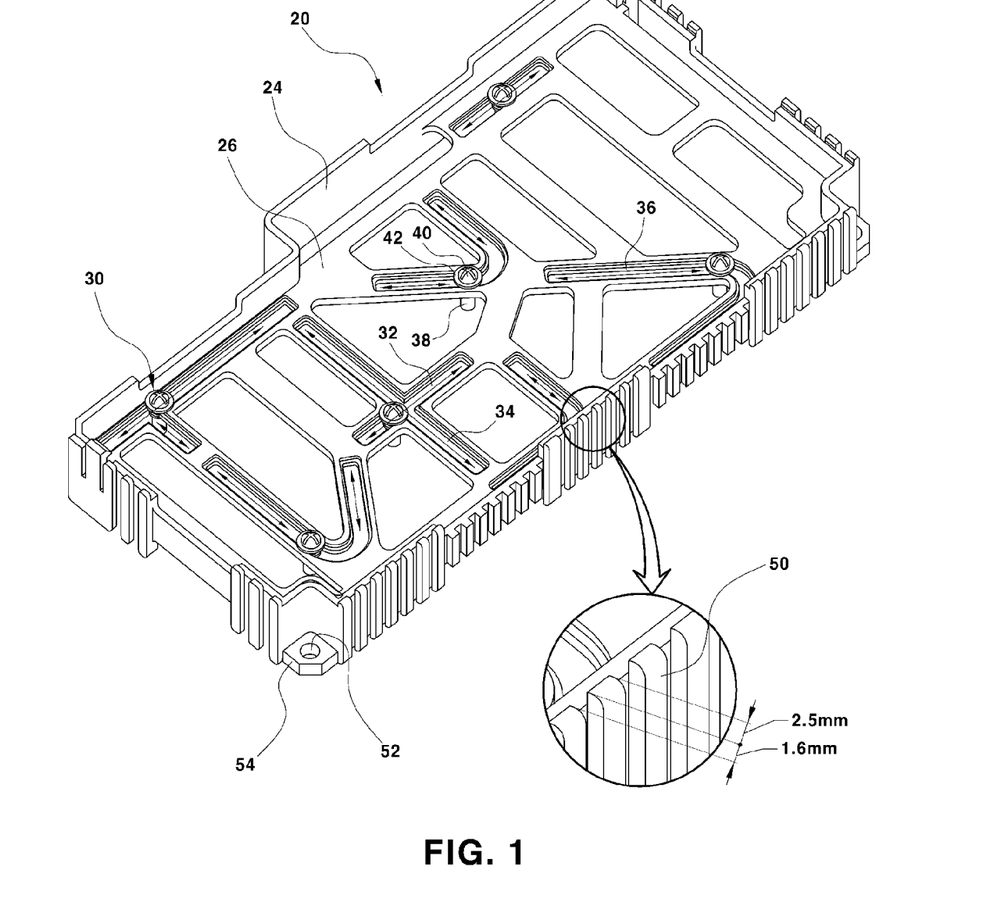
FIGS. 1 and 2 are perspective views showing a heat emission device for a junction box PCB according to an exemplary embodiment of the present invention.
Figure 2:
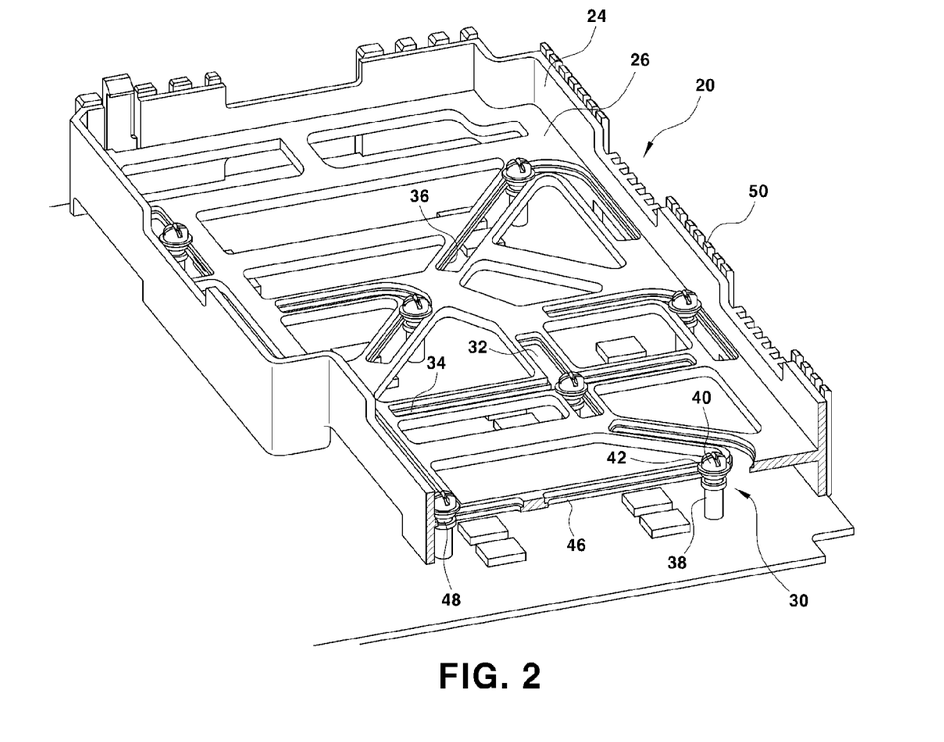

In a preferred exemplary embodiment of the present invention, an assembly end 54 having an assembly hole 52 for coupling with the heat emission and protection metallic case 10 may be further formed integrally with each corner position of the four-direction side plate 24 of the heat absorption and emission metallic board 20, as shown in FIG. 1. Therefore, by engaging a metallic bolt into the assembly hole 52 of the assembly end 54, the heat absorption and emission metallic board 20 and the heat emission and protection metallic case 10, which may be formed of the same metallic material, contact in such a way as to transfer heat to each other.

Additionally, to emit heat from the lower PCB 12 transferred through the heat transfer boss 38, as well as the upper PCB 22 to the outside, a plurality of heat-emission ribs 50, may be formed so as to protrude at equal intervals from an outer surface of the four-direction side plate 24 of the heat absorption and emission metallic board 20. Preferably, to maximize a contact area between the plurality of heat-emission ribs 50 and the air, the heat-emission ribs 50 are oriented to span the height of the four-direction side plate 24 (i.e., perpendicular to lower PCB 12) and arranged densely with a width of 2 mm and a thickness of 1.6 mm on the outer surface of the four-direction side plate 24.

Figure 4:
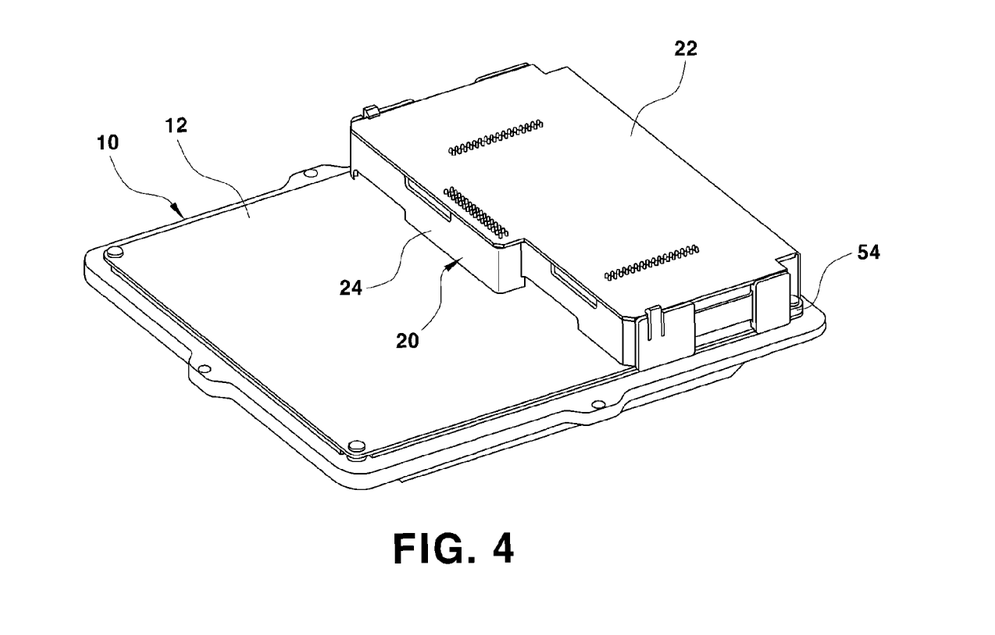
FIG. 4 is a perspective view showing an assembled exterior of a heat emission device for a junction box PCB according to an exemplary embodiment of the present invention.
Figure 5:
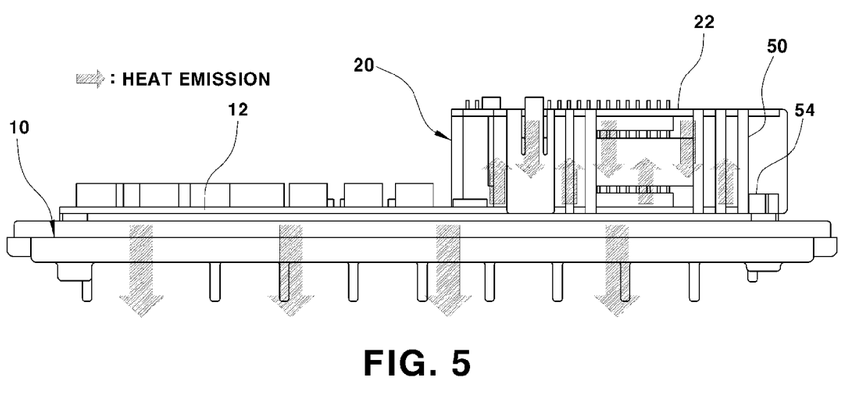
FIG. 5 is a side view depicting a heat emission flow of a heat emission device for a junction box PCB according to an exemplary embodiment of the present invention.

With reference to FIGS. 4 and 5, a description will be made of a heat absorption and emission flow of a heat emission device of a junction box PCB structured above according to an exemplary embodiment of the present invention.

First, for a next-generation intelligent junction box, the lower PCB 12 including an IPS semiconductor device for high current may be seated and assembled onto the heat emission and protection metallic case 10, after which a metallic bolt may be engaged into the assembly hole 52 of the assembly end 54 of the heat absorption and emission metallic board 20, such that the heat absorption and emission metallic board 20 and the heat emission and protection metallic case 10 may contact one another in such a way as to transfer heat to each other.

Next, before the upper PCB 22 is seated and assembled onto the heat absorption and emission metallic board 20, the heat transfer boss 38 may be moved to a desired position along the up/down slot 32, the left/right slot 34, and/or the diagonal slot 36 formed on the bottom plate 26 of the heat absorption and emission metallic board 20. In other words, after the heat transfer boss 38 is moved to a position adjacent to an IPS semiconductor device which generates a high degree of heat from the semiconductor devices attached to the lower PCB 12, the fastening screw 40 may be inserted into the fastening screw groove of the heat transfer boss 38 and then fastened, and at the same time, the thermal grease 56 may be applied to a lower portion of the heat transfer boss 38 that contact the lower PCB 12, thereby facilitating heat transfer from the lower PCB 12 toward the heat transfer boss 38. Then, the upper PCB 22 may be folded from the lower PCB 12 to be seated and assembled onto the heat absorption and emission metallic board 20.

Therefore, although heat generated in an IPS semiconductor device, or the like, attached to the lower PCB 12 may be partially emitted through the heat emission and protection metallic case 10, most of the heat may be rapidly transferred to the heat absorption and emission metallic board 20 through the heat transfer boss 38 adjacent to the IPS semiconductor device and emitted to the outside, especially through the heat emission ribs 50 formed on the outer surface of the four-direction side plates 24 of the heat absorption and emission metallic board 20.

As such, the junction box can be properly disposed and mounted in a limited small space of a vehicle, and the heat transfer boss 38 may be moved to a position adjacent to an IPS semiconductor device generating high-temperature heat along the respective slots 32, 34, and 36 formed on the bottom plate 26 of the heat absorption and emission metallic board 20 to induce rapid heat emission, thereby providing a next-generation intelligent junction box capable of preventing thermal shutdown of the junction box.

Accordingly, the present invention provides the following effects.

According to the present invention, when a PCB having an IPS semiconductor device mounted thereon is applied to a junction box of a vehicle, the large-area PCB having an IPS semiconductor device mounted thereon may be mounted as a dual-layer structure including upper and lower foldable PCBs, making it possible to easily install the PCB in a limited small space typically found in a the vehicle.

In particular, by depositing and assembling the heat absorption and emission metallic board having the upper PCB mounted thereon onto the heat emission and protection metallic case having the lower PCB mounted thereon, high-temperature heat generated by the IPS semiconductor device of the dual-layer structure PCB may be effective emitted/radiated through the heat absorption and emission metallic board having the upper PCB mounted thereon, as well as through the heat emission and protection metallic case, thereby maximizing heat emission (i.e., cooling) effects.

Moreover, the heat transfer boss may be movably mounted on the heat absorption and emission metallic board, such that the heat transfer boss may be moved to a position adjacent to the IPS semiconductor device generating high-temperature heat on the entire area of the PCB, thereby rapidly emitting heat from the IPS semiconductor device to outside.

As a result, the next-generation intelligent junction box may be provided, which may be properly mounted in the limited small space of a vehicle, and may prevent thermal shutdown through rapid heat emission when the temperature of electronic devices such as, for example, an IPS device sharply increases due to vehicle operations (e.g., electrical/electronic loads).

While an exemplary embodiment of the present invention has been described in detail, the present invention is not limited to the foregoing embodiment and it will be appreciated by those skilled in the art that various modifications and improvements using the basic concept of the present invention defined in the appended claims are also included in the protection scope of the present invention.

[Description of Reference Numerals]

| | |
|---|---|
| 10: Heat Emission and Protection Metallic Case | 12: Lower Printed Circuit Board (PCB) |
| 20: Heat Absorption and Emission Metallic Board | 22: Upper PCB |
| 24: Side Plate | 26: Bottom Plate |
| | 32: Up/Down Slot |

| [Description of Reference Numerals] | |
|---|---|
| 30: Heat Absorption and Emission Means | 36: Diagonal Slot |
| 34: Left/Right Slot | 40: Fastening Screw |
| 38: Heat Transfer Boss | 48: Slide Groove |
| 42: Washer | 52: Assembly Hole |
| 46: Slide Protruding End | 56: Thermal Grease |
| 50: Heat Emission Rib | 60: Film Insulator |
| 54: Assembly End | |
| 58: Conductive Metallic Pattern | |

What is claimed is:

1. A heat emission device for a junction box printed circuit board (PCB), comprising:
   a metallic case;
   a lower PCB that is mounted on the metallic case;
   a metallic board that is mounted on the lower PCB and transfers heat; and
   an upper PCB that is mounted on the metallic board and conducts electricity with the lower PCB,
   wherein the metallic board comprises a bottom plate with a plurality of slots formed thereon, wherein each slot accepts one or more heat transfer bosses, which contact the lower PCB so as to transfer heat,
   wherein the one or more heat transfer bosses slides along the respective slots.

2. The heat emission device of claim 1, wherein the metallic board further comprises four side plates.

3. The heat emission device of claim 1, wherein the plurality of slots comprise a slide protruding end integrally associated with the lower perimeter of the inner walls of each slot,
   wherein the one or more heat transfer bosses slides along the slide protruding end.

4. The heat emission device of claim 3, wherein the one or more heat transfer bosses comprise a slide groove that mates with the slide protruding end of each slot.

5. The heat emission device of claim 1, wherein a fastening screw groove is formed on a top surface of each transfer boss, and a washer is applied to the fastening screw groove to allow a fastening screw to be inserted into and engaged with the fastening screw groove.

6. The heat emission device of claim 5, wherein the washer contacts an upper surface of the bottom plate.

7. The heat emission device of claim 2, wherein a plurality of heat emission ribs are formed on one or more of the four side plates of the metallic board.

8. The heat emission device of claim 7, wherein the plurality of heat emission ribs are spaced at equal intervals along each side of the metallic board.

9. The heat emission device of claim 8, wherein the plurality of heat emission ribs are about 2 mm wide and about 1.6 mm thick.

10. The heat emission device of claim 7, wherein the plurality of heat emission ribs are oriented to span the height of each side of the metallic board.

11. The heat emission device of claim 1, wherein the metallic board further comprises one or more assembly holes for coupling the metallic board with the metallic case.

12. The heat emission device of claim 11, wherein the one or more assembly holes are located at one or more corresponding corners of the metallic board.

13. The heat emission device of claim 1, wherein a thermal grease is applied to a lower end of the one or more heat transfer bosses to improve heat transfer between the lower PCB and the one or more heat transfer bosses.

14. The heat emission device of claim 1, wherein the metallic board further comprises one or more mounting clips to mount the upper PCB.

15. The heat emission device of claim 8, wherein one or more of the plurality of heat emission ribs may be longer than the height of one or more sides of the metallic board.

16. The heat emission device of claim 1, wherein the one or more heat transfer bosses are positioned in the plurality of slots so as to be proximate to one or more sources of heat generation located on the lower PCB.

17. The heat emission device of claim 1, wherein the upper PCB comprises a film insulator and a metallic pattern.

18. The heat emission device of claim 1, wherein the upper PCB is folded.

* * * * *